US 9,108,828 B2
Aug. 18, 2015

(12) United States Patent
Bolde

(10) Patent No.: US 9,108,828 B2
(45) Date of Patent: Aug. 18, 2015

(54) LIFT MECHANISM

(71) Applicant: International Business Machines Corporation, Armonk, NY (US)

(72) Inventor: Lannie R. Bolde, Ulster Park, NY (US)

(73) Assignee: International Business Machines Corporation, Armonk, NY (US)

(*) Notice: Subject to any disclaimer, the term of this patent is extended or adjusted under 35 U.S.C. 154(b) by 124 days.

(21) Appl. No.: 13/741,924

(22) Filed: Jan. 15, 2013

(65) Prior Publication Data

US 2014/0199141 A1    Jul. 17, 2014

(51) Int. Cl.
| | | |
|---|---|---|
| *B60P 3/00* | (2006.01) | |
| *B66B 9/16* | (2006.01) | |
| *B66F 9/07* | (2006.01) | |
| *H05K 7/14* | (2006.01) | |

(52) U.S. Cl.
CPC ............... *B66F 9/07* (2013.01); *H05K 7/1488* (2013.01)

(58) Field of Classification Search
CPC ......... B65G 1/0407; B65G 1/026; B65G 1/06
USPC .................................. 414/286, 458; 187/244
See application file for complete search history.

(56) References Cited

U.S. PATENT DOCUMENTS

| | | | | |
|---|---|---|---|---|
| 6,022,180 | A * | 2/2000 | Motoyama et al. ........... | 414/277 |
| 6,135,697 | A * | 10/2000 | Isaacs et al. .................. | 414/281 |
| 6,431,809 | B1 * | 8/2002 | Teich ............................ | 414/286 |
| 6,524,052 | B1 * | 2/2003 | Yamauchi et al. ......... | 414/331.1 |
| 7,090,457 | B2 | 8/2006 | Martin | |
| 7,661,920 | B2 * | 2/2010 | Kantola et al. ................ | 414/280 |
| 2003/0049105 | A1 * | 3/2003 | Mueller et al. ................ | 414/277 |
| 2003/0221914 | A1 * | 12/2003 | Smith et al. .................... | 187/244 |
| 2004/0216957 | A1 | 11/2004 | Hansl et al. | |
| 2008/0056867 | A1 * | 3/2008 | Zuckerman ................... | 414/458 |

FOREIGN PATENT DOCUMENTS

| | | |
|---|---|---|
| EP | 2269890 A2 | 1/2011 |
| WO | 02059020 A1 | 8/2002 |

OTHER PUBLICATIONS

"Method and System for Loading Field Replaceable Units (FRU) Onto a Rack", IP.Com; Jul. 11, 2011; pp. 1-6.
"The Safe, Effective and Efficient Way to Handle Computer Servers and Related Equipment", Server Lift Corporation; Jul. 2009; Version 7.0; pp. 1-22.

* cited by examiner

*Primary Examiner* — Saul Rodriguez
*Assistant Examiner* — Emery Hassan
(74) *Attorney, Agent, or Firm* — Cantor Colburn LLP; Margaret McNamara

(57) ABSTRACT

A lift mechanism is provided. The lift mechanism includes a frame having a base, a spine extending from the base and a table, adjustment units configured to permit table adjustments, an attachment mechanism by which the table is attachable to a rack frame and a driving unit configured to drive a load relative to the rack frame.

10 Claims, 6 Drawing Sheets

LIFT MECHANISM

BACKGROUND

The present invention relates to a lift mechanism, and more specifically, to a universal lift mechanism for large component installation and removal.

As technology drives increasingly dense and compact packaging, individual components within high end servers are becoming too heavy and difficult to handle during service installations or repairs. With space being limited, this problem is further complicated by inadequate service clearance as servers are arranged on customer floors. Current solutions to these problems include a rack frame attachment lifting device whereby the field replacement unit (FRU) is lifted onto the device and the device is used to lift the FRU to the desired location within the rack frame.

Due to their complex attachment systems and limited weight lifting capabilities, the solutions described above have become or are becoming obsolete. In particular, they may not be usable for servicing water cooled FRUs. They may also be incompatible with more than one type of rack frame.

SUMMARY

According to one embodiment of the present invention, a lift mechanism is provided. The lift mechanism includes a frame having a base, a spine extending from the base and a table, adjustment units configured to permit table adjustments, an attachment mechanism by which the table is attachable to a rack frame and a driving unit configured to drive a load relative to the rack frame.

According to another embodiment, a lift mechanism for insertion or removal of a load into or out of a rack frame is provided. The lift mechanism includes a frame having a base, a spine extending from the base and a table, a table height adjustment unit configured to permit adjustment of a height of the table, a table angle adjustment unit configured to permit adjustment of an angle of the table, an attachment mechanism by which the table is attachable to the rack frame and a driving unit configured to drive the load into or out of the rack frame.

According to yet another embodiment, a method for insertion or removal of a load into or out of a rack frame is provided. The method includes positioning a frame having a base, a spine extending from the base and a table proximate to the rack frame, actuating a table height adjustment unit at the base to adjust a height of the table, actuating a table angle adjustment unit at the spine to adjust an angle of the table, following table height and table angle adjustments, attaching the table to the rack frame and, with the table attached to the rack frame, driving the load into or out of the rack frame.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The description provided below relates to a lift mechanism that is modified to include lifting height operation from a front or rear position, table angle adjustment to compensate for table sag when loaded, an attachment mechanism for attaching the table to a rack frame and a driving unit for driving a load, such as a Field Replacement Unit (FRU), in and out of the rack frame. The lift mechanism can also be used to carry FRUs from one rack frame to another.

Figure 1:
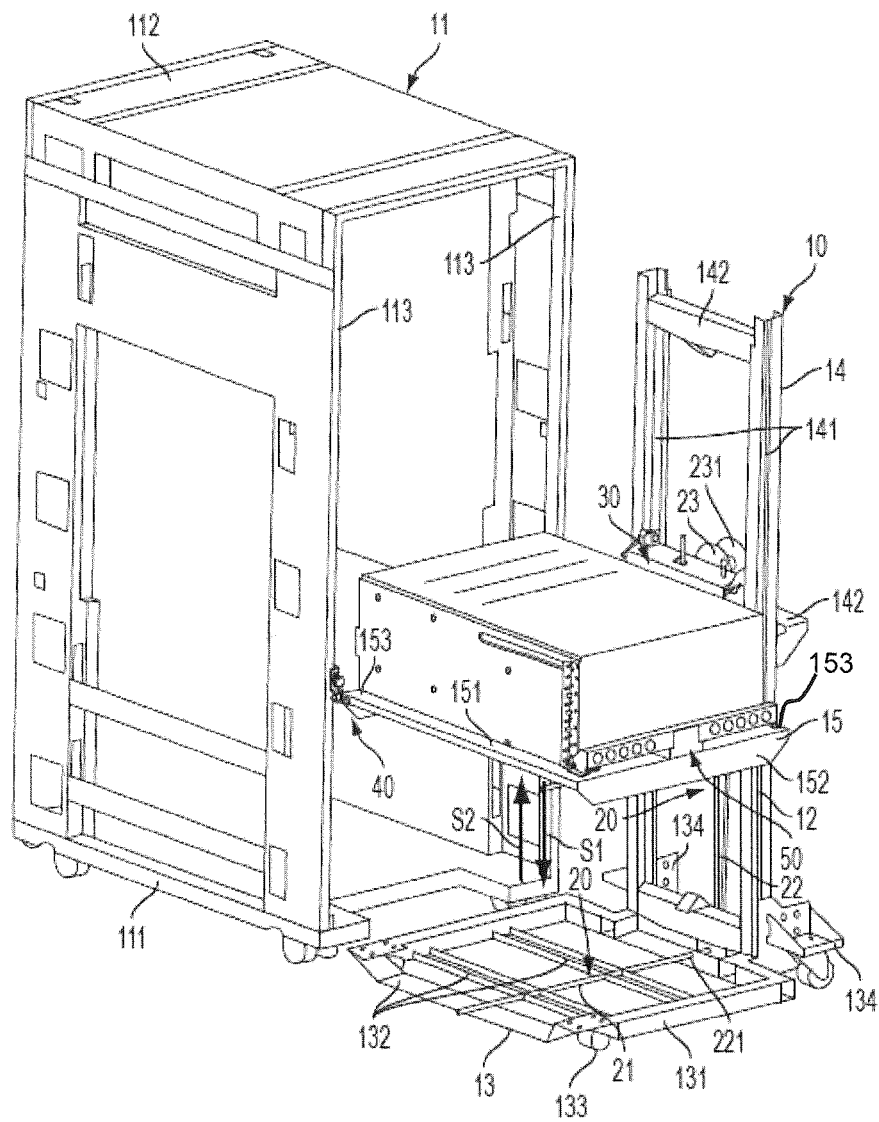
FIG. 1 is a perspective view of a lift mechanism in accordance with embodiments.

With reference to FIG. 1, a lift mechanism 10 is provided. The lift mechanism 10 can be used for various applications relating to the movement, insertion, installation, replacement or repair of large or heavy loads. As an example, the lift mechanism 10 may be used for the insertion or removal of an FRU into or out of a rack frame 11. The rack frame 11 is a substantially rectangular enclosure having a wheel-mounted base portion 111, a ceiling portion 112 and substantially vertical walls 113. The substantively vertical walls 113 define multiple height options for the insertion or removal of the FRU into and out of the rack frame 11.

The lift mechanism 10 includes a lift mechanism frame 12 having a wheel-mounted base 13, a spine 14 and a table 15. The wheel-mounted base 13 includes a U-shaped base frame 131, cross beams 132 for structural support, wheel mounts 133 for connection with first and second wheels and opposed wheel brackets 134 for connection with third and fourth wheels. The wheel mounts 133 are disposed at distal ends of the U-shaped base frame 131 and the opposed wheel brackets 134 are disposed at a main member of the U-shaped base frame 131. The spine 14 extends substantially vertically from the opposed wheel brackets 134 and includes substantially vertical members 141 and cross beams 142 for structural support. The substantially vertical members 141 may each be bracket shaped (i.e., U-shaped) and oriented to face inwardly toward one another. The table 15 has a planar surface 151, which is sufficiently sized and shaped to support a load thereon, sidewalls 152 that add structural rigidity to the table 15 and an edge portion 153.

The lift mechanism 10 further includes a table height adjustment unit 20, a table angle adjustment unit 30, an attachment mechanism 40 and a driving unit 50. The table height adjustment unit 20 is configured to permit adjustment of a height of the table 15 relative to the wheel-mounted base 13 and along the height-axis of the substantially vertical members 141 of the spine 14 (i.e., an adjustment in a first, vertical dimension). The table angle adjustment unit 30 is configured to permit adjustment of an angle of the table 15

(i.e., an adjustment in a second, radial dimension) and can be used to counter the tendency of the table 15 to sag under the load. The attachment mechanism 40 permits the table 15 to be attachable to the rack frame 11 once the table height and table adjustments are completed. The driving unit 50 is configured to drive the load into or out of the rack frame 11 with the table 15 attached to the rack frame 11 by way of the attachment mechanism 40.

Still referring to FIG. 1 and, in accordance with embodiments, the table height adjustment unit 20 includes a screw member 21 supported across the cross beams 132 of the wheel-mounted base 13, a pulley system 22, which is coupled to the screw member 21 via a lower pulley wheel 221, and a winch and cable system 23, which is coupled to the pulley system 22 and the table 15. Rotation of the screw member 21 is transmitted to the winch and cable system 23 via the pulley system 22. The transmitted rotation drives the winch thereby utilizing cables to climb up or down the substantially vertical members 141 to thereby raise or lower a height of the table 15. The winch and cable system 23 may include a main pulley wheel 231 that registers with the pulley system 22 and lateral gears that register with the main pulley wheel 231 and tightly fit within the substantially vertical members 141. As shown in FIG. 1, the screw member 21 is configured to be actuated at one or more of the opposite sides of the wheel mounted base 13.

Figure 2A:
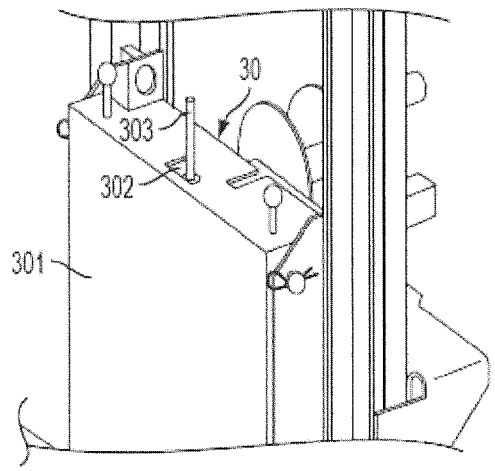
FIG. 2A is a perspective view of a table angle adjustment unit of the lift mechanism of FIG. 1.
Figure 2B:
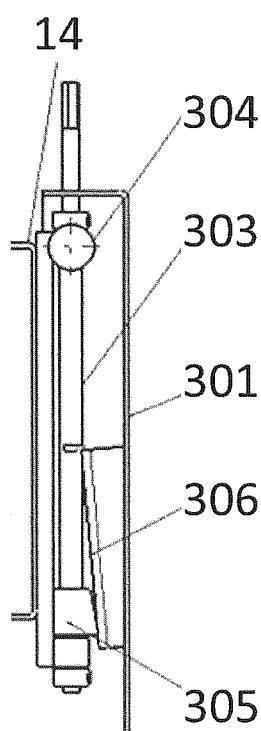
FIG. 2B is a side view of the table angle adjustment unit of the lift mechanism of FIG. 1.

With reference to FIGS. 1, 2A and 2B, the table angle adjustment unit 30 includes pivot pins 31 by which the table 15 is attached to the spine 14 when the pivot pins are engaged. When the pivot pins 31 are retracted, the table 15 may be removed from the lift mechanism 10. Thus, the table 15 can be selectively replaced with another table that may be more suited to a particular application making the lift mechanism 10, as a whole, universal.

The table angle adjustment unit 30 is configured to cause the table 15 to pivot about an edge portion 153 of the table 15. The table angle adjustment unit 30 includes an enclosure 301 that is formed to define a guide groove 302 and a threaded shaft 303 that is contained within the guide groove 302 and coupled to the table 15. The threaded shaft 303 extends through the guide groove 302 such that a distal, threaded end thereof is actuatable at an exterior of the enclosure 301. Due to the coupling of the threaded shaft 303 and the table 15, such actuations cause the table 15 to pivot about the edge portion 153. In this way, as a load is transferred on to the planar surface 151 and causes the table to sag accordingly (see arrow S1 in FIG. 1), the threaded shaft 303 can be actuated such that the table 15 pivots about the edge portion 153 in a directed that counters the sag tendency (see arrow S2 in FIG. 1).

In accordance with an embodiment and, as shown in FIG. 2B, the table angle adjustment unit 30 may further include a table pivot axis 304 about which the table 15 and the enclosure 301 can pivot in accordance with an actuation of the threaded shaft 303. In this case, the threaded shaft 303 is provided with a pivot nut 305 that is displaced vertically as the threaded shaft 303 is actuated such that the sides of the pivot nut impinge upon the angle plate 306. This impingement causes the table 15 and the enclosure 301 to pivot as a unit about the pivot axis 304.

Figure 3:
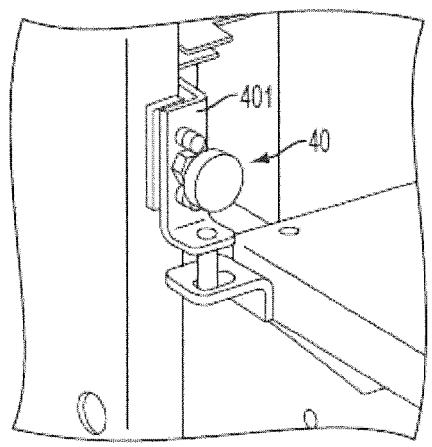
FIG. 3 is a perspective view of an attachment mechanism of the lift mechanism of FIG. 1.
Figure 4:
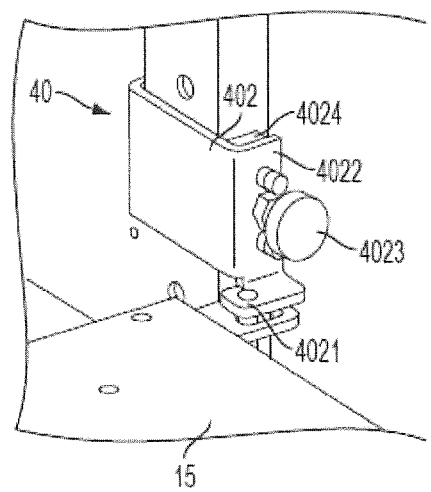
FIG. 4 is a perspective view of an attachment mechanism of the lift mechanism of FIG. 1.

With reference to FIGS. 3 and 4, the attachment mechanism 40 includes a right-side frame mount 401 and a left-side frame mount 402 that oppose one another. The right-side frame mount 402 is rotatable connectable with the table 15 via pin connection 4021 and includes a bracket 4022, a knob 4023 and a spring-loaded plate element 4024. The bracket 4022 is sized and shaped to partially enclose an edge portion of the corresponding one of the substantially vertical walls 113 of the rack frame 11. The knob 4023 and the spring-loaded plate element 4024 are configured to be tightened about the edge portion of the corresponding one of the substantially vertical walls 113. The left-side frame mount 401 is similarly configured for connection to the other corresponding one of the substantially vertical walls 113 of the rack frame 11 and does not require additional description.

Figure 5:
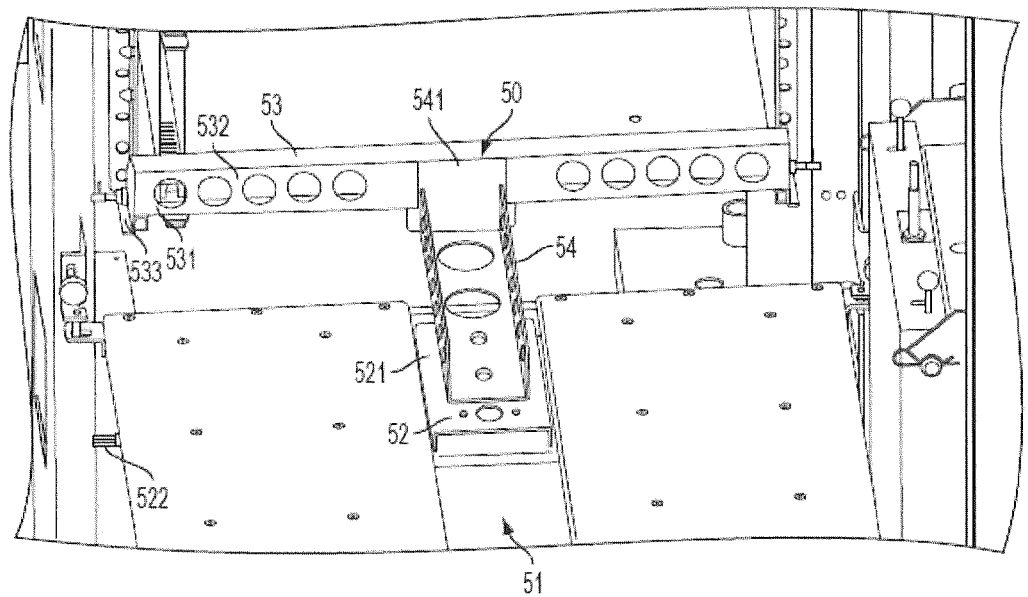
FIG. 5 is a perspective view of a driving unit of the lift mechanism of FIG. 1.
Figure 6:
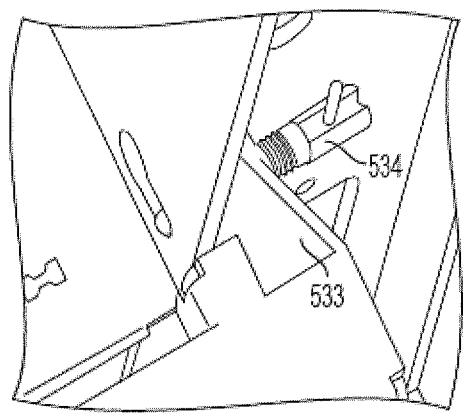
FIG. 6 is an enlarged perspective view of a component of the driving unit of FIG. 5.
Figure 7:
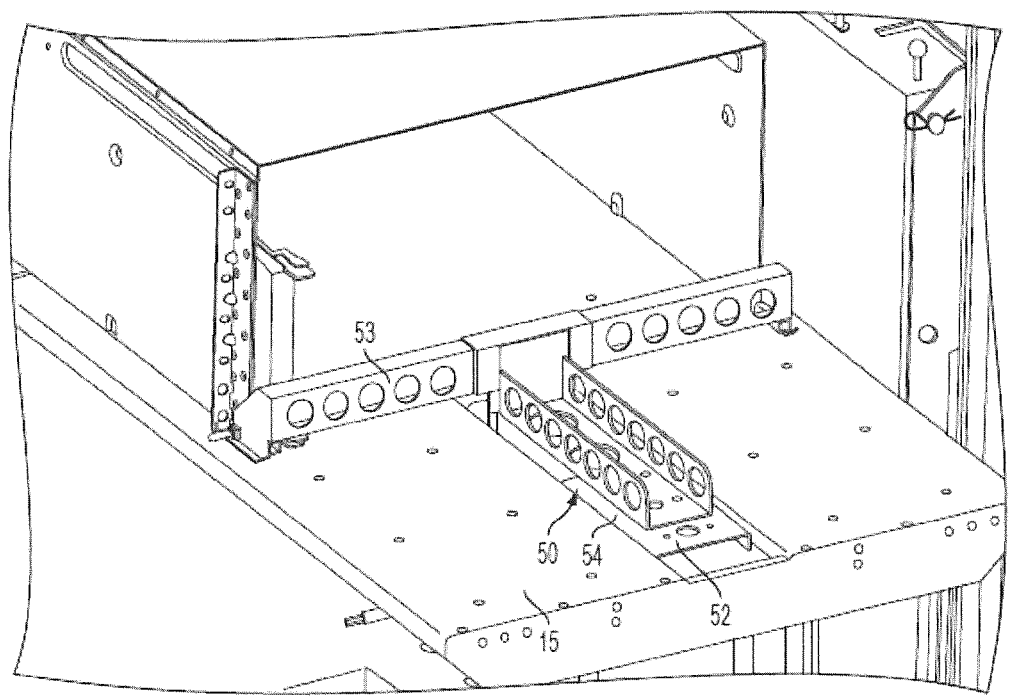
FIG. 7 is a perspective view of the driving unit of FIG. 5 in use.

With reference to FIGS. 5-7, the driving unit 50 will now be described. As shown in FIGS. 5 and 7, the table 15 is formed to define a groove 51 that extends along an axis of the table 15. When the lift mechanism 10 is disposed adjacent to the rack frame 11, the groove 51 extends away from the rack frame 11 in a direction corresponding to an insertion or removal direction of the load into or from the rack frame 11. The driving unit 50 includes a carriage 52, a driving bracket 53 and a hitch mount 54. The carriage 52 is slidably coupled to an underside of the table 15 and is configured to be selectively translated along the axis of the table 15. The carriage 52 includes a boss portion 521 that slides along the axis of the table 15 within the groove 51 and an elongate member 522 that extends from the boss portion 521 to a point beyond a side of the table 15. The elongate member 522 is thus grippable by an operator who can move or manipulate the elongate member 522 and thereby the boss portion 521 along the axis of the table 15.

The driving bracket 53 is attachable to the load and the hitch mount 54 serves to couple the driving bracket 53 to the boss portion 521 of the carriage 52. Both the boss portion 521 and the hitch mount 54 are narrower than the groove 51.

In accordance with embodiments, the hitch mount 54 may be formed as an elongate bracket having a plate member 541 at a first end thereof, which is connectable with a central portion of the driving bracket 53. A second end of the hitch mount 54 is connectable with the boss portion 521. In some cases, the first end of the hitch mount 54 trails the second end in the load insertion/removal direction (see FIG. 5) although it is to be understood that this is merely exemplary and that other configurations of the hitch mount 54 are possible. For example, in alternative cases, the hitch mount 54 may be formed such that the first end thereof leads the second end in the load insertion/removal direction (see FIG. 1).

The driving bracket 53 has a width that extends along an entire width of the load to be inserted into or removed from the rack frame 11 and may be formed as a corner bracket with a lower plate portion 531, a substantially vertical plate portion 532 and lateral plate portions 533. The lower plate portion 531, the substantially vertical plate portion 532 and the lateral plate portions 533 are formed to encompass a lower edge portion of the load to be inserted into or removed from the rack frame 11.

As shown in particular in FIG. 6, the driving bracket 53 may further include spring-loaded plunger elements 534. The spring-loaded plunger elements 534 are respectively coupled with each of the lateral plate portions 533 and are configured to engage with corresponding holes defined by sides of the load. The holes defined by the sides of the load have large diameter and small diameter portions. Inward tips of the spring-loaded plunger elements 534 have diameters that correspond to the diameters of the small diameter portions. Thus, as the driving bracket 53 approaches the load, the spring-loaded plunger elements 534 can be retracted so that the driving bracket 53 can continue to approach and register with the load. Once registry occurs, the spring-loaded plunger elements 534 can be released so that the inward tips extend into the large diameter portions of the holes. The driving bracket 53 can then be freely withdrawn from the rack frame 11 until the inward tips register with the small diameter portions of the holes. At this point, further withdrawal of the driving bracket 53 will be associated with removal of the load from the rack frame 11, as shown in FIG. 7.

Figure 8:
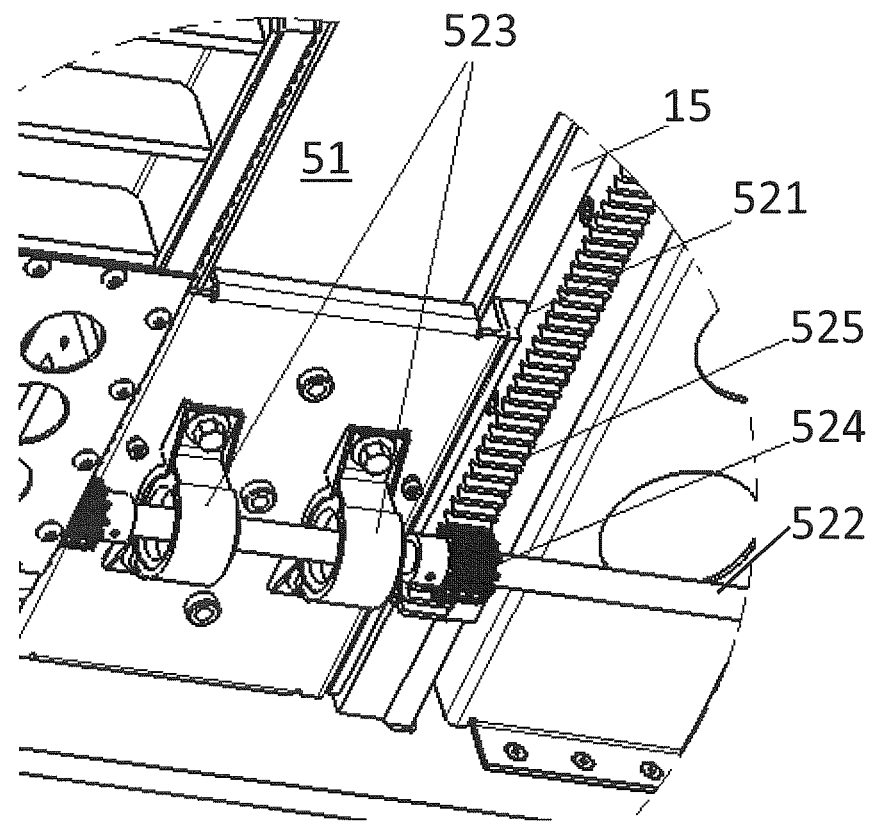
FIG. 8 is a perspective view of the driving unit in accordance with further embodiments.

In accordance with an embodiment and, with reference to FIG. 8, the driving unit 50 may include a rack and pinion configuration. As shown in FIG. 8, the elongate member 522 may be rotatably supported and attached to the boss portion 521 by shaft bearings 523 such that a drive pinion gear 524 disposed on the elongate member 522 registers with a rack gear 525 disposed along an underside of the table 15. Thus, as the elongate member 522 is rotated about a longitudinal axis thereof, the boss portion 521 is transported through the groove 51.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A lift mechanism, comprising:
   a frame having a base, a spine extending from the base and a table formed to define a groove extending along an axis thereof;
   adjustment units configured to permit table adjustments;
   an attachment mechanism by which the table is attachable to a rack frame, the attachment mechanism comprising opposed left and right side frame mounts that are rotatably connected with the table via respective pin connections; and
   a driving unit configured to drive a load relative to the rack frame, wherein the driving unit comprises:
   a carriage coupled to an underside of the table and configured to be selectively translated along the axis of the table;
   a bracket, which is attachable to the load, the bracket extending along an entire width of the load and comprising a lower plate portion, a substantially vertical plate portion and lateral plate portions formed to encompass a lower edge portion of the load; wherein the bracket comprises plungers configured to engage with the load; and
   a hitch mount which is narrower than the groove and by which the bracket is coupled to the carriage.

2. The lift mechanism according to claim 1, wherein the adjustment units are configured to permit table adjustments in at least two dimensions.

3. The lift mechanism according to claim 1, wherein each of the opposed left and right side frame mounts comprises:
   a bracket sized and shaped to partially enclose an edge portion of a substantially vertical wall of the rack frame; and
   a knob and a spring-loaded plate element configured to be tightened about the edge portion of the substantially vertical wall.

4. The lift mechanism according to claim 3, wherein each of the opposed left and right side frame mounts further comprises spring-loaded guide pins.

5. A lift mechanism for insertion or removal of a load into or out of a rack frame, comprising:
   a frame having a base, a spine extending from the base and a table formed to define a groove extending along an axis thereof;
   a table height adjustment unit configured to permit adjustment of a height of the table;
   a table angle adjustment unit configured to permit adjustment of an angle of the table;
   an attachment mechanism by which the table is attachable to the rack frame, the attachment mechanism comprising opposed left and right side frame mounts that are rotatably connected with the table via respective pin connections; and
   a driving unit configured to drive the load into or out of the rack frame, wherein the driving unit comprises:
   a carriage coupled to an underside of the table and configured to be selectively translated along the axis of the table;
   a bracket, which is attachable to the load, the bracket extending along an entire width of the load and comprising a lower plate portion, a substantially vertical plate portion and lateral plate portions formed to encompass a lower edge portion of the load; wherein the bracket comprises plungers configured to engage with the load; and
   a hitch mount which is narrower than the groove and by which the bracket is coupled to the carriage.

6. The lift mechanism according to claim 5, wherein the table height adjustment unit is configured to be actuated at opposite sides of the base.

7. The lift mechanism according to claim 5, wherein the table angle adjustment unit is configured to cause the table to pivot about an edge of the table.

8. The lift mechanism according to claim 5, wherein each of the opposed left and right side frame mounts comprises:
   a bracket sized and shaped to partially enclose an edge portion of a substantially vertical wall of the rack frame; and
   a knob and a spring-loaded plate element configured to be tightened about the edge portion of the substantially vertical wall.

9. The lift mechanism according to claim 8, wherein each of the opposed left and right side frame mounts further comprises spring-loaded guide pins.

10. A method for insertion or removal of a load into or out of a rack frame, comprising:

positioning a frame having a base, a spine extending from the base and a table proximate to the rack frame and formed to define a groove extending along an axis thereof;

actuating a table height adjustment unit at the base to adjust a height of the table;

actuating a table angle adjustment unit at the spine to adjust an angle of the table;

following table height and table angle adjustments, attaching the table to the rack frame; and with the table attached to the rack frame, driving the load into or out of the rack frame, wherein the attaching comprises:

rotatably connecting opposed left and right side frame mounts with the table via respective pin connections;

partially enclosing edge portions of substantially vertical walls of the rack frame with brackets of the opposed left and right side frame mounts; and tightening a knob and a spring-loaded plate element of the opposed left and right side frame mounts about the edge portions of the substantially vertical walls, and wherein the driving is achieved by a driving unit comprising:

a carriage coupled to an underside of the table and configured to be selectively translated along the axis of the table;

a bracket, which is attachable to the load, the bracket extending along an entire width of the load and comprising a lower plate portion, a substantially vertical plate portion and lateral plate portions formed to encompass a lower edge portion of the load; wherein the bracket comprises plungers configured to engage with the load; and a hitch mount which is narrower than the groove and by which the bracket is coupled to the carriage.

* * * * *